United States Patent
Ghosh et al.

(10) Patent No.: US 7,435,356 B2
(45) Date of Patent: Oct. 14, 2008

(54) ABRASIVE-FREE CHEMICAL MECHANICAL POLISHING COMPOSITIONS AND METHODS RELATING THERETO

(75) Inventors: Tirthankar Ghosh, Oreland, PA (US); Robert D. Solomon, Souderton, PA (US); Hongyu Wang, Wilmington, DE (US)

(73) Assignee: Rohm and Haas Electronic Materials CMP Holdings, Inc., Newark, DE (US)

( * ) Notice: Subject to any disclaimer, the term of this patent is extended or adjusted under 35 U.S.C. 154(b) by 422 days.

(21) Appl. No.: 10/996,689

(22) Filed: Nov. 24, 2004

(65) Prior Publication Data

US 2006/0110924 A1    May 25, 2006

(51) Int. Cl.
*C09K 13/00* (2006.01)
(52) U.S. Cl. .................. 252/79.1; 252/79.2; 252/79.3; 252/79.4
(58) Field of Classification Search ............... 252/79.1, 252/79.2, 79.3, 79.4
See application file for complete search history.

(56) References Cited

U.S. PATENT DOCUMENTS

| | | | |
|---|---|---|---|
| 6,117,775 A | 9/2000 | Kondo et al. | |
| 6,326,299 B1 | 12/2001 | Homma et al. | |
| 6,562,719 B2 | 5/2003 | Kondo et al. | |
| 6,585,568 B2 | 7/2003 | Tsuchiya et al. | |
| 6,605,537 B2 | 8/2003 | Bian et al. | |
| 6,620,037 B2 | 9/2003 | Kaufman et al. | |
| 6,632,259 B2 | 10/2003 | Weinstein et al. | |
| 2003/0181345 A1 | 9/2003 | Bian | |
| 2003/0219982 A1 | 11/2003 | Kurata et al. | |
| 2003/0228763 A1 | 12/2003 | Schroeder et al. | |
| 2004/0023492 A1 | 2/2004 | Bian et al. | |
| 2004/0092102 A1 | 5/2004 | Li et al. | |
| 2006/0000150 A1* | 1/2006 | Kelley et al. | 51/298 |

FOREIGN PATENT DOCUMENTS

| | | |
|---|---|---|
| EP | 1 211 717 A1 | 6/2002 |
| EP | 1 223 609 A1 | 7/2002 |
| WO | WO 99/64527 A1 | 12/1999 |
| WO | WO 01/14496 A1 | 3/2001 |
| WO | WO 02/094957 A2 | 11/2002 |

* cited by examiner

*Primary Examiner*—George A. Goudreau
(74) *Attorney, Agent, or Firm*—Blake T. Biederman

(57) ABSTRACT

An aqueous abrasive-free composition is useful for chemical mechanical polishing of a patterned semiconductor wafer containing a nonferrous metal. The composition comprises an oxidizer, an inhibitor for the nonferrous metal, 0 to 15 weight percent water soluble modified cellulose, 0 to 15 weight percent phosphorus compound, 0.005 to 5 weight percent of an amphiphilic polymer, the amphiphilic polymer having an ionic hydrophilic portion with a carbon number of 2 to 250 and water.

8 Claims, 1 Drawing Sheet

ABRASIVE-FREE CHEMICAL MECHANICAL POLISHING COMPOSITIONS AND METHODS RELATING THERETO

BACKGROUND OF THE INVENTION

The invention relates to chemical mechanical polishing (CMP) of semiconductor wafer materials and, more particularly, to CMP compositions and methods for polishing metal interconnects on semiconductor wafers in the presence of dielectrics and barrier materials.

Typically, a semiconductor wafer is a wafer of silicon with a dielectric layer containing multiple trenches arranged to form a pattern for circuit interconnects within the dielectric layer. The pattern arrangements usually have a damascene structure or dual damascene structure. A barrier layer covers the patterned dielectric layer and a metal layer covers the barrier layer. The metal layer has at least sufficient thickness to fill the patterned trenches with metal to form circuit interconnects.

CMP processes often include multiple polishing steps. For example, a first step removes excess interconnect metals, such as copper at an initial high rate. After the first step removal, a second step polishing can remove metal that remains on the barrier layer outside of the metal interconnects. Subsequent polishing removes the barrier from an underlying dielectric layer of a semiconductor wafer to provide a planar polished surface on the dielectric layer and the metal interconnects.

The metal in a trench or trough on the semiconductor substrate provides a metal line forming a metal circuit. One of the problems to be overcome is that the polishing operation tends to remove metal from each trench or trough, causing recessed dishing of such metal. Dishing is undesirable as it causes variations in the critical dimensions of the metal circuit. To reduce dishing, polishing is performed at a lower polishing pressure. However, merely reducing the polishing pressure would require that polishing continue for a lengthened duration; and dishing would continue to be produced for the entire lengthened duration.

Schroeder et al., in US Pat. Pub. No. 2003/0228763, disclose a method of using amphiphilic nonionic surfactants for impacting copper dishing and dielectric erosion. As patterned wafer polishing technology moves to decreased line widths, there is a continuing need for a method to reduce dishing of metal in trenches or troughs without lengthening the duration of the polishing operation. Furthermore, there is a need for polishing compositions that leave a surface clear of interconnect metal residue after a short polishing time.

STATEMENT OF THE INVENTION

An aspect of the invention provides an aqueous abrasive-free composition useful for chemical mechanical polishing of a patterned semiconductor wafer containing a nonferrous metal comprising an oxidizer, an inhibitor for the nonferrous metal, 0 to 15 weight percent water soluble modified cellulose, 0 to 15 weight percent phosphorus compound, 0.005 to 5 weight percent of an amphiphilic polymer, the amphiphilic polymer having an ionic hydrophilic portion with a carbon number of 2 to 250 and water.

An alternative aspect of the invention provides an aqueous abrasive-free composition useful for chemical mechanical polishing of a patterned semiconductor wafer containing a nonferrous metal comprising 0 to 25 weight percent oxidizer, 0.05 to 15 weight percent inhibitor for the nonferrous metal, 0 to 15 weight percent complexing agent for the nonferrous metal, 0.01 to 5 weight percent water soluble modified cellulose, 0.01 to 10 weight percent phosphorus compound, 0.01 to 3 weight percent of an amphiphilic polymer, the amphiphilic polymer having an ionic hydrophilic portion with a carbon number of 5 to 100 and a number average molecular weight of 50 to 4,000 and water.

An alternative aspect of the invention provides a method for chemical mechanical polishing of a patterned semiconductor wafer containing a nonferrous metal comprising, a) contacting the wafer with a polishing composition, the polishing composition comprising an oxidizer, an inhibitor for the nonferrous metal, 0 to 15 weight percent water soluble modified cellulose, 0 to 15 weight percent phosphorus compound, 0.005 to 5 weight percent of an amphiphilic polymer, the amphiphilic polymer having an ionic hydrophilic portion with a carbon number of 2 to 250 and water; and b) polishing the wafer with a polishing pad.

DETAILED DESCRIPTION

Figure 1:
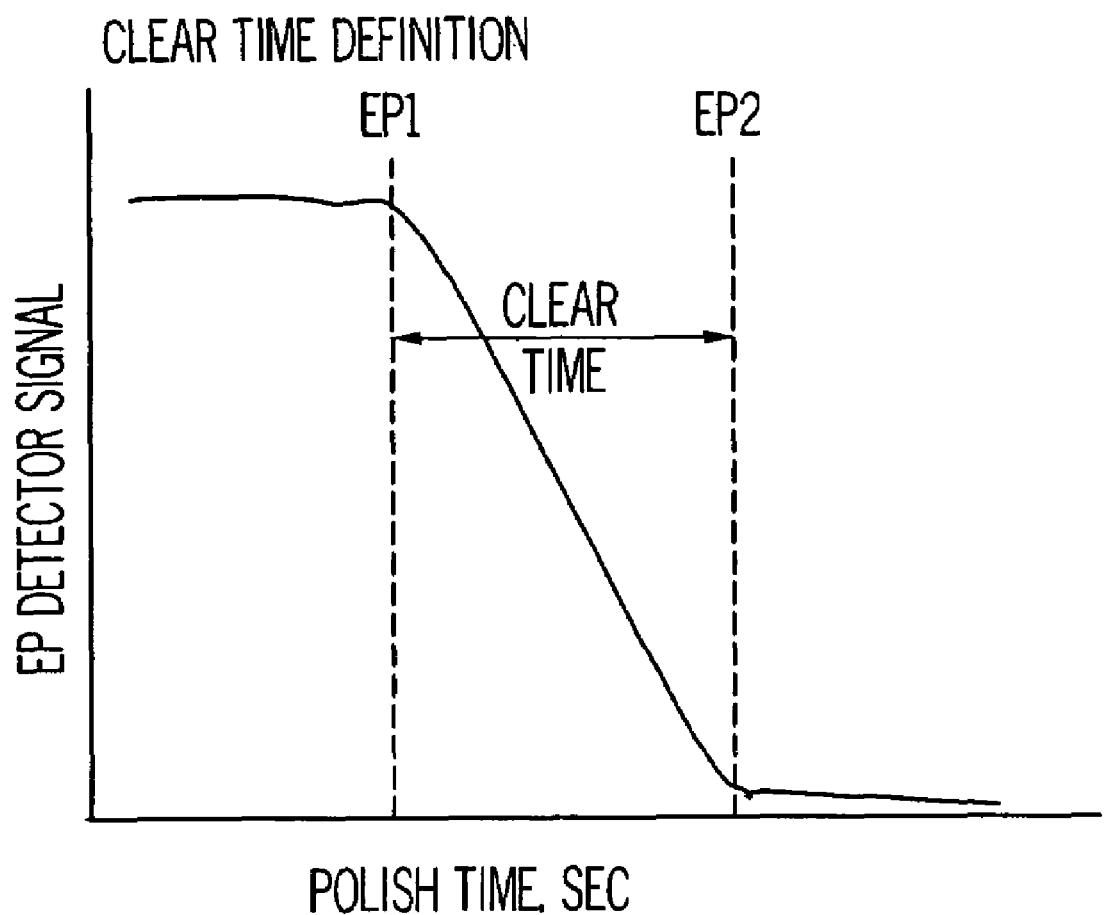
FIG. 1 is a graphical description of clear time.

The composition and method provide good metal removal rates and adequate metal clearing with ultra low dishing of the metal interconnects when a semiconductor wafer is exposed to CMP and a polishing composition containing an amphiphilic polymer. Optionally, the composition may contain a water soluble modified cellulose, a water miscible organic solvent, and a phosphorus compound. The solution is abrasive-free and does not require any abrasive.

The amphiphilic polymers referred to in this specification are block copolymers comprised of a hydrophobic segment and a hydrophilic segment. The hydrophilic segment can be polymeric chains with a carbon number varying from 2 to 250. For purposes of this specification, carbon number represents the number of carbon atoms in the hydrophilic segment. Preferably, the carbon number is 5 to 100 and most preferably, 5 to 50. The hydrophilic segment is ionic. The number of monomeric units of the hydrophilic segment preferably varies from 1 to 100. Advantageously, the composition contains 0.005 to 5 weight percent of these amphiphilic polymers. Preferably, the composition contains 0.01 to 3 weight percent of these amphiphilic polymers. Most preferably, the composition contains 0.05 to 2 weight percent of these amphiphilic polymers.

The amphiphilic polymers' preferred number average molecular weight is 50 to 5,000—this specification refers to amphiphilic polymers' molecular weight in terms of number average molecular weight. More preferably, the number average molecular weight is between 50 and 4,000 and most preferably the number average molecular weight is between 100 and 3,000. Ionic segments include cationic, anionic, and zwitterions (polyampholytes and polybetaines). Preferably, the hydrophilic segment is anionic such as, polyacrylic acid or a polymethacrylic acid. The hydrophilic segment preferably contains polyacrylic acid, polymethacrylic acid or a copolymer of acrylic acid and methacrylic acid. The combining of these segments into a copolymer produces molecules with properties different than their respective homopolymers that facilitate clearing without excessive dishing of metal interconnects. The hydrophobic end of the polymer may include hydrocarbon chains or an alkylmercaptan. Most preferably, the hydrophobic and hydrophilic segments combine in the form of a copolymer.

Optionally, the composition contains 0 to 10 weight percent water miscible organic solvent—this specification refers to all compositional ranges in weight percent. Typically, such water miscible organic solvents are alcohols or ketones, such as at least one of methanol, ethanol, 1-propanol, 2-propanol, ethylene glycol, 1,2-propanediol, glycerol, acetone, and methyl ethyl ketone. Advantageously, the composition contains 0.005 to 10 weight percent of these organic solvents. Preferably, the composition contains 0.01 to 7.5 weight percent of these organic solvents. Most preferably, the composition contains 0.02 to 5 weight percent of these organic solvents.

Although the present invention has particular usefulness in copper interconnects, the present aqueous polishing composition also provides enhanced polishing of other nonferrous metal interconnects, such as aluminum, gold, nickel, platinum group metals, silver, tungsten, and alloys thereof.

Optionally, the composition contains 0 to 15 water soluble cellulose. Preferably, the composition contains 0.01 to 5.0 weight percent of water soluble cellulose. Most preferably, the composition contains 0.05 to 1.5 weight percent of water soluble cellulose. Exemplary modified cellulose are anionic gums such as at least one of agar gum, arabic gum, ghatti gum, karaya gum, guar gum, pectin, locust bean gum, tragacanth gums, tamarind gum, carrageenan gum, and xantham gum, modified starch, alginic acid, mannuronic acid, guluronic acid, and their derivatives and copolymers. The preferred water soluble cellulose, carboxy methyl cellulose (CMC), has a degree of substitution of 0.1 to 3.0 with a weight average molecular weight of 1K to 1,000K. More preferred, the CMC has a degree of substitution of 0.7 to 1.2 with a weight average molecular weight of 40K to 250K. Degree of substitution in CMC is the number of hydroxyl groups on each anhydroglucose unit in the cellulose molecule that is substituted. It can be considered as a measure of the "density" of carboxylic acid groups in the CMC.

The solution contains an oxidizer. Preferably, the solution contains 0 to 25 weight percent oxidizer. More preferably, the oxidizer is in the range of 5 to 10 weight percent. The oxidizer is particularly effective at assisting the solution in removing copper at low pH ranges. The oxidizing agent can be at least one of a number of oxidizing compounds, such as hydrogen peroxide ($H_2O_2$), monopersulfates, iodates, magnesium perphthalate, peracetic acid and other per-acids, persulfates, bromates, periodates, nitrates, iron salts, cerium salts, Mn (III), Mn (IV) and Mn (VI) salts, silver salts, copper salts, chromium salts, cobalt salts, halogens, hypochlorites and a mixture thereof. Furthermore, it is often advantageous to use a mixture of oxidizer compounds. When the polishing slurry contains an unstable oxidizing agent such as, hydrogen peroxide, it is often most advantageous to mix the oxidizer into the composition at the point of use.

Further, the solution contains an inhibitor to control removal of nonferrous metal, such as, copper interconnect removal rate by static etch or other removal mechanism. Adjusting the concentration of an inhibitor adjusts the interconnect metal removal rate by protecting the metal from static etch. Preferably, the solution contains 0.05 to 15 weight percent inhibitor. Most preferably, the solution contains 0.2 to 1.0 weight percent inhibitor. The inhibitor may consist of a mixture of inhibitors. Azole inhibitors are particularly effective for copper and silver interconnects. Typical azole inhibitors include benzotriazole (BTA), mercaptobenzothiazole (MBT), tolytriazole (TTA) and imidazole. Blends of azole inhibitors can increase or decrease copper removal rate. BTA is a particularly effective inhibitor for copper and silver.

In addition to the inhibitor, the composition optionally contains complexing agent for the nonferrous metal. The complexing agent may facilitate the removal rate of the metal film, such as copper. Preferably, the composition contains 0 to 15 weight percent complexing agent for the nonferrous metal. Most preferably, the composition contains 0.1 to 1 weight percent complexing agent for the nonferrous metal. Example complexing agents include acetic acid, citric acid, ethyl acetoacetate, glycolic acid, lactic acid, malic acid, oxalic acid, salicylic acid, sodium diethyl dithiocarbamate, succinic acid, tartaric acid, thioglycolic acid, glycine, alanine, aspartic acid, ethylene diamine, trimethyl diamine, malonic acid, gluteric acid, 3-hydroxybutyric acid, propionic acid, phthalic acid, isophthalic acid, 3-hydroxy salicylic acid, 3,5-dihydroxy salicylic acid, gallic acid, gluconic acid, pyrocatechol, pyrogallol, tannic acid, including, salts and mixtures thereof. Preferably, the complexing agent is selected from the group consisting of acetic acid, citric acid, ethyl acetoacetate, glycolic acid, lactic acid, malic acid, oxalic acid and mixtures thereof. Most preferably, the complexing agent is malic acid.

Optionally, the composition includes 0 to 15 weight percent phosphorous-containing compound. For purposes of this specification, a "phosphorus-containing" compound is any compound containing a phosphorus atom. A preferred phosphorus-containing compound is, for example, a phosphate, pyrophosphate, polyphosphate, phosphonate, including, their acids, salts, mixed acid salts, esters, partial esters, mixed esters, and mixtures thereof, for example, phosphoric acid. In particular, a preferred aqueous polishing composition can be formulated using, for example, the following phosphorus-containing compounds: zinc phosphate, zinc pyrophosphate, zinc polyphosphate, zinc phosphonate, ammonium phosphate, ammonium pyrophosphate, ammonium polyphosphate, ammonium phosphonate, diammonium phosphate, diammonium pyrophosphate, diammonium polyphosphate, diammonium phosphonate, guanidine phosphate, guanidine pyrophosphate, guanidine polyphosphate, guanidine phosphonate, iron phosphate, iron pyrophosphate, iron polyphosphate, iron phosphonate, cerium phosphate, cerium pyrophosphate, cerium polyphosphate, cerium phosphonate, ethylene-diamine phosphate, piperazine phosphate, piperazine pyrophosphate, piperazine phosphonate, melamine phosphate, dimelamine phosphate, melamine pyrophosphate, melamine polyphosphate, melamine phosphonate, melam phosphate, melam pyrophosphate, melam polyphosphate, melam phosphonate, melem phosphate, melem pyrophosphate, melem polyphosphate, melem phosphonate, dicyanodiamide phosphate, urea phosphate, including, their acids, salts, mixed acid salts, esters, partial esters, mixed esters, and mixtures thereof. Also, phosphine oxides, phosphine sulphides and phosphorinanes and of phosphonates, phosphites and phosphinates may be used, including, their acids, salts, mixed acid salts, esters, partial esters and mixed esters. A preferred phosphorus-containing compound is ammonium phosphate.

Advantageously, the phosphorus-containing compound of the polishing composition of the present invention is present in an amount effective to increase polishing rates at low down force pressures. It is believed that even a trace amount of the phosphorus-containing compound in the polishing composition is effective for polishing the copper. A satisfactory polishing rate at acceptable polishing down force pressures is obtained by using the phosphorus-containing compound in an amount of 0.01 to 10 weight percent of the composition. A preferred range for the phosphorus-containing compound is 0.1 to 5 weight percent of the composition. Most preferably, the phosphorus-containing compound is 0.3 to 2 weight percent of the composition.

The compounds provide efficacy over a broad pH range in solutions containing a balance of water. This solution's useful pH range extends from at least 2 to 5. In addition, the solution preferably relies upon a balance of deionized water to limit incidental impurities. The pH of the polishing fluid of this invention is preferably from 2 to 4, more preferably a pH of 2.5 to 4. The acids used to adjust the pH of the composition of this invention are, for example, nitric acid, sulfuric acid, hydrochloric acid, phosphoric acid and the like. Exemplary bases used to adjust the pH of the composition of this invention are, for example, ammonium hydroxide and potassium hydroxide.

The composition of the present invention is applicable to any semiconductor wafer containing a conductive metal, such as copper, aluminum, tungsten, platinum, palladium, gold, or iridium; a barrier or liner film, such as tantalum, tantalum nitride, titanium, or titanium nitride; and an underlying dielectric layer. For purposes of the specification, the term dielectric refers to a semi-conducting material of dielectric constant, k, which includes low-k and ultra-low k dielectric materials. The composition and method are excellent for preventing erosion of multiple wafer constituents, for example, porous and nonporous low-k dielectrics, organic and inorganic low-k dielectrics, organic silicate glasses (OSG), fluorosilicate glass (FSG), carbon doped oxide (CDO), tetraethylorthosilicate (TEOS) and a silica derived from TEOS. The compositions of this invention may also be used for ECMP (Electrochemical Mechanical Polishing).

EXAMPLES

Some embodiments of the invention will now be described in detail in the following Examples. In these examples, weight percent solids for the copolymer compositions were determined by gravimetric analysis. Number average molecular weight was determined by aqueous gel permeation chromatography using TSK-GEL pn/08025 GMPWx and TSK-GEL pn/08020 G2500PWx columns in series with a refractive index detector and sodium phosphate buffer eluent.

Example 1

Preparation of Dodecylmercaptan-Terminated Acrylic Acid Block Copolymer

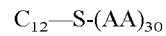

$C_{12}-S-(AA)_{30}$

The polymerization was conducted in a 1-liter, four neck round bottom reaction flask equipped with a mechanical stirrer, temperature control device, condenser, monomer feed line, catalyst feed line chain transfer agent feed line, and nitrogen sweep. These ingredients were added according to the following procedure. 190 g of tertiary butyl alcohol were charged to the flask and heated to 80-82° C. under a nitrogen sweep. 50 g of tertiary butyl alcohol and 192.6 g of acrylic acid were charged to a monomer feed tank. 10 g of tertiary butyl alcohol and 19.0 g of n-dodecylmercaptan were charged to a chain transfer feed tank. 24 g of tertiary butyl alcohol and 4.8 g of tertiary butyl peroxypivalate were charged to a initiator feed tank. Upon reaching a temperature of 82° C., the three feeds were started simultaneously. The monomer was fed for 2 hours at rate of 2.1 g per minute. The chain transfer agent was fed for 2 hours at a rate of 0.25 g per minute. The initiator was fed for 2 hours at a rate of 0.21 g per minute. The reaction was maintained at 80-82° C. Upon completion of the feeds, 5 g of tertiary butyl alcohol was added to the monomer feed tank and fed into the reaction flask. 5 g of tertiary butyl alcohol was added to the chain transfer feed tank and fed into the reaction flask. 7 g of tertiary butyl alcohol was added to the initiator feed tank and fed into the reaction flask. 202 g of deionized water was then fed into the reaction flask over one hour while maintaining the temperature at 80-82° C. The reaction was cooled to 65° C. and residual monomers were reduced by the addition of ferrous sulfate, tertiary butyl peroxide, and sodium sulfoxylate formaldehyde. The reaction was cooled to room temperature. A clear solution was obtained at 29.3 weight percent solids. The number average molecular weight was determine by aqueous gel permeation chromatography to be 2134. Drying the solution in a vacuum oven at room temperature overnight yielded a white solid.

Example 2

Preparation of Dodecylmercaptan-Terminated Acrylic Acid Block Copolymer

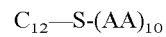

$C_{12}-S-(AA)_{10}$

The polymerization was conducted in a 1-liter, four neck round bottom reaction flask equipped with a mechanical stirrer, temperature control device, condenser, monomer feed line, catalyst feed line chain transfer agent feed line, and nitrogen sweep. These ingredients were added according to the following procedure. 190 g of tertiary butyl alcohol were charged to the flask and heated to 80-82° C. under a nitrogen sweep. 50 g of tertiary butyl alcohol and 192.6 g of acrylic acid were charged to a monomer feed tank. 30 g of tertiary butyl alcohol and 53.1 g of n-dodecylmercaptan were charged to a chain transfer feed tank. 24 g of tertiary butyl alcohol and 4.8 g of tertiary butyl peroxypivalate were charged to a initiator feed tank. Upon reaching a temperature of 82° C., the three feeds were started simultaneously. The monomer was fed for 2 hours at rate of 2.1 g per minute. The chain transfer agent was fed for 2 hours at a rate of 0.70 g per minute. The initiator was fed for 2 hours at a rate of 0.21 g per minute. The reaction was maintained at 80-82° C. Upon completion of the feeds, 5 g of tertiary butyl alcohol was added to the monomer feed tank and fed into the reaction flask. 5 g of tertiary butyl alcohol was added to the chain transfer feed tank and fed into the reaction flask. 7 g of tertiary butyl alcohol was added to the initiator feed tank and fed into the reaction flask. 240 g of tertiary butyl alcohol was then added to the reaction flask and the reaction held at 80-82° C. for one hour. The reaction was cooled to room temperature. A clear solution was obtained at 30.1 weight percent solids. The number average molecular weight was determine by aqueous gel permeation chromatography to be 796. Drying the solution in a vacuum oven at room temperature overnight yielded a white solid.

Example 3

Preparation of Dodecylmercaptan-Terminated Methacrylic Acid Block Copolymer $C_{12}—S\text{-}(MAA)_{30}$ The polymerization was conducted in a 1-liter, four neck round bottom reaction flask equipped with a mechanical stirrer, temperature control device, condenser, monomer feed line, catalyst feed line chain transfer agent feed line, and nitrogen sweep. These ingredients were added according to the following procedure. 190 g of 1-propanol were charged to the flask and heated to 80-82° C. under a nitrogen sweep. 50 g of 1-propanol and 192.6 g of methacrylic acid were charged to a monomer feed tank. 10 g of 1-propanol and 16.0 g of n-dodecylmercaptan were charged to a chain transfer feed tank. 24 g of 1-propanol and 4.8 g of tertiary butyl peroxypivalate were charged to a initiator feed tank. Upon reaching a temperature of 82° C., the three feeds were started simultaneously. The monomer was fed for 2 hours at rate of 2.1 g per minute. The chain transfer agent was fed for 2 hours at a rate of 0.25 g per minute. The initiator was fed for 2 hours at a rate of 0.21 g per minute. The reaction was maintained at 80-82° C. Upon completion of the feeds, 5 g of tertiary butyl alcohol was added to the monomer feed tank and fed into the reaction flask. 5 g of tertiary butyl alcohol was added to the chain transfer feed tank and fed into the reaction flask. 7 g of tertiary butyl alcohol was added to the initiator feed tank and fed into the reaction flask. 299.5 g of 1-propanol was then added to the reaction flask and the reaction held at 80-82° C. for one hour. The reaction was cooled to room temperature. A clear solution was obtained at 29.9 weight percent solids. The number average molecular weight was determine by aqueous gel permeation chromatography to be 2347. Drying the solution in a vacuum oven at room temperature overnight yielded a white solid.

Example 4

Preparation of Dodecylmercaptan-Terminated Methacrylic Acid Block Copolymer $C_{12}—S\text{-}(MAA)_{10}$ The polymerization was conducted in a 1-liter, four neck round bottom reaction flask equipped with a mechanical stirrer, temperature control device, condenser, monomer feed line, catalyst feed line chain transfer agent feed line, and nitrogen sweep. These ingredients were added according to the following procedure. 190 g of 1-propanol were charged to the flask and heated to 80-82° C. under a nitrogen sweep. 50 g of 1-propanol and 192.6 g of methacrylic acid were charged to a monomer feed tank. 30 g of 1-propanol and 44.6 g of n-dodecylmercaptan were charged to a chain transfer feed tank. 24 g of 1-propanol and 4.8 g of tertiary butyl peroxypivalate were charged to a initiator feed tank. Upon reaching a temperature of 82° C., the three feeds were started simultaneously. The monomer was fed for 2 hours at rate of 2.1 g per minute. The chain transfer agent was fed for 2 hours at a rate of 0.62 g per minute. The initiator was fed for 2 hours at a rate of 0.21 g per minute. The reaction was maintained at 80-82° C. Upon completion of the feeds, 5 g of tertiary butyl alcohol was added to the monomer feed tank and fed into the reaction flask. 5 g of tertiary butyl alcohol was added to the chain transfer feed tank and fed into the reaction flask. 7 g of tertiary butyl alcohol was added to the initiator feed tank and fed into the reaction flask. The reaction held at 80-82° C. for one hour. The reaction was cooled to room temperature. A clear solution was obtained at 45.3 weight percent solids. The number average molecular weight was determine by aqueous gel permeation chromatography to be 1144. Drying the solution in a vacuum oven at room temperature overnight yielded a white solid.

Example 5

Preparation of Octadecylmercaptan-Terminated Methacrylic Acid Block Copolymer $C_{18}—S\text{-}(MAA)_{30}$ The polymerization was conducted in a 1-liter, four neck round bottom reaction flask equipped with a mechanical stirrer, temperature control device, condenser, monomer feed line, catalyst feed line chain transfer agent feed line, and nitrogen sweep. These ingredients were added according to the following procedure. 180 g of tertiary butyl alcohol were charged to the flask and heated to 80-82° C. under a nitrogen sweep. 50 g of tertiary butyl alcohol and 192.6 g of acrylic acid were charged to a monomer feed tank. 25.1 g of octadecylmercaptan was dissolved into 20 g of tertiary butyl alcohol on a steam bath then charged to a chain transfer feed tank. 24 g of tertiary butyl alcohol and 4.8 g of tertiary butyl peroxypivalate were charged to a initiator feed tank. Upon reaching a temperature of 82° C., the three feeds were started simultaneously. The monomer was fed for 2 hours at rate of 2.1 g per minute. The chain transfer agent was fed for 2 hours at a rate of 0.62 g per minute. The initiator was fed for 2 hours at a rate of 0.21 g per minute. The reaction was maintained at 80-82°

C. Upon completion of the feeds, 5 g of tertiary butyl alcohol was added to the monomer feed tank and fed into the reaction flask. 15 g of tertiary butyl alcohol was added to the chain transfer feed tank and fed into the reaction flask. 7 g of tertiary butyl alcohol was added to the initiator feed tank and fed into the reaction flask. 202 g of deionized water was then added to the reaction flask and the reaction held at 80-82° C. for one hour. The reaction was cooled to 65° C. and residual monomers were reduced by the addition of ferrous sulfate, tertiary butyl peroxide, and sodium sulfoxylate formaldehyde. The reaction was cooled to room temperature. A clear solution was obtained at 28.6 weight percent solids. The number average molecular weight was not characterized. Drying the solution in a vacuum oven at room temperature overnight yielded a white solid.

Example 6

Polishing Rate

In this Example, all compositions contain, by weight percent, 0.50 BTA, 0.22 malic acid, 0.32 carboxymethylcellulose (CMC), 1.0 methyl alcohol, 0.10 amphiphilic polymer, 0.50 ammonium phosphate, and 9.00 hydrogen peroxide at a pH of 3.5—pH adjusted with nitric acid with a balance deionized water. An IPEC 472 polishing machine using an IC1000™ polyurethane polishing pad (Rohm and Haas Electronic Materials, CMP Technologies) under varied downforce conditions, a polishing solution flow rate of 160 cc/min, a platen speed of 80 RPM and a carrier speed of 75 RPM polished Cu sheet wafers to determine removal rate in Å/min. A Kinik diamond abrasive disk conditioned the polishing pad.

TABLE 1

| Slurry | Downforce (psi) | Downforce (kPa) | Amphiphilic Polymer | Temperature (° C.) | Cu Removal Rate (Å/min) |
|---|---|---|---|---|---|
| 1 | 1 | 6.9 | $C_{12}$-S-$(AA)_{30}$ | 25.5 | 674 |
| 2 | 2 | 13.8 | $C_{12}$-S-$(AA)_{30}$ | 31.7 | 2644 |
| 3 | 3 | 20.7 | $C_{12}$-S-$(AA)_{30}$ | 36.1 | 4911 |
| 4 | 1 | 6.9 | $C_{12}$-S-$(MAA)_{30}$ | 26.7 | 958 |
| 5 | 2 | 13.8 | $C_{12}$-S-$(MAA)_{30}$ | 70.2 | 3655 |
| 6 | 3 | 20.7 | $C_{12}$-S-$(MAA)_{30}$ | 35.5 | 6023 |

The above data illustrate that amphiphilic polymers $C_{12}$—S-$(AA)_{30}$ and $C_{12}$—S-$(MAA)_{30}$ each provide acceptable copper removal rates; and that alkylmercaptan/methacrylic acid copolymers, such as, $C_{12}$—S-$(MAA)_{30}$ provide the greatest increase in removal rate.

Example 7

Polishing Clear Rate

In this Example all compositions contained, by weight percent, 0.50 BTA, 0.22 malic acid, 0.32 carboxymethylcellulose (CMC), 1.00 methyl alcohol, 0.50 ammonium phosphate, and 9.00 hydrogen peroxide at a pH of 3.5—pH adjusted with nitric acid with a balance deionized water.

The experiment measured copper polishing rates and determined the clearing of residual copper from a semiconductor wafer at a moderate down force pressure. In particular, the test determined the effect of the utilization of 0.1 weight percent Rohm and Haas polymer dodecylmercaptan-terminated methacrylic acid block copolymer $C_{12}$—S-$(MAA)_{30}$ on the polishing rate, clear time, and residual copper clearing. Clear time is defined as EPD2-EPD1 (in seconds), where EPD1 is the initial endpoint detection time at which the first sign of barrier layer is detected through the copper layer. EPD2 is the detection time at which the detector sees only barrier layer. FIG. 1 graphically shows this definition of clear time. An Applied Materials, Inc. Mirra 200 mm polishing machine equipped with an ISRM detector system using an IC1010™ polyurethane polishing pad (Rohm and Haas Electronic Materials CMP Inc.) under downforce conditions of 2 psi (13.8 kPa), a polishing solution flow rate of 150 cc/min, a platen speed of 80 RPM, and a carrier speed of 40 RPM planarized the samples. A Kinik diamond abrasive disk conditioned the polishing pad.

The Rohm and Haas polymer $C_{12}$—S-$(MAA)_{30}$ was made via solution polymerization with a mercaptan chain transfer agent and methacrylic acid. This particular copolymer was targeted for low molecular weight. It was a low molecular block copolymer.

TABLE 2

| Slurry | Non-Saccharide Polymer (0.1 wt %) | Metal RR Å/min | Dishing 90% Å | Dishing 50 μm Å | Dishing 90/10 Å | Dishing 100/1 Å | Dishing 100 μm Å | Clear Time (s) EPD2 – EPD1 |
|---|---|---|---|---|---|---|---|---|
| A | PAA/MAA* | 4074 | 237 | 219 | 425 | 390 | 246 | 70 |
| 7 | $C_{12}$-S-$(MAA)_{30}$ | 3813 | 218 | 186 | 319 | 284 | 187 | 93 |

*polyacrylic acid/methacrylic acid copolymer (3:2 ratio, 23K molecular weight)

As illustrated in Table 2, the addition of 0.10 weight percent Rohm and Haas copolymer $C_{12}$—S-$(MAA)_{30}$ gives a good copper removal rate with low dishing. The amphiphilic polymer is especially effective for polishing high-density copper features.

The invention claimed is:

1. An aqueous abrasive-free composition useful for chemical mechanical polishing of a patterned semiconductor wafer containing a nonferrous metal comprising an oxidizer, an inhibitor for the nonferrous metal, 0 to 15 weight percent water soluble modified cellulose, 0 to 15 weight percent phosphorus compound, 0.005 to 5 weight percent of an amphiphilic polymer, the amphiphilic polymer having an ionic hydrophilic portion with a carbon number of 2 to 250 and a hydrophobic end, the ionic hydrophilic portion containing an anionic hydrophilic segment, the hydrophilic segment containing polyacrylic acid, polymethacrylic acid or a copolymer of polyacrylic acid, polymethacrylic acid, the hydrophobic end including an alkylmercaptan and water.

2. The composition of claim 1 wherein the amphiphilic polymer has a number average molecular weight of 50 to 5,000.

3. The composition of claim 2 wherein the amphiphilic polymer is a copolymer formed with acrylic acid or methacrylic acid.

4. The composition of claim 1 wherein the amphiphilic polymer is a alkylmercaptan/methacrylic acid block copolymer.

5. An aqueous abrasive-free composition useful for chemical mechanical polishing of a patterned semiconductor wafer containing a nonferrous metal comprising 0 to 25 weight percent oxidizer, 0.05 to 15 weight percent inhibitor for the nonferrous metal, 0 to 15 weight percent complexing agent for the nonferrous metal, 0.01 to 5 weight percent water soluble modified cellulose, 0.01 to 10 weight percent phosphorus compound, 0.01 to 3 weight percent of an amphiphilic polymer, the amphiphilic polymer having a hydrophobic end and an ionic hydrophilic portion with a carbon number of 5 to 100 and a number average molecular weight of 50 to 4,000, the ionic hydrophilic portion containing an anionic hydrophilic segment, the hydrophilic segment containing polyacrylic acid, polymethacrylic acid or a copolymer of polyacrylic acid, polymethacrylic acid, the hydrophobic end including an alkylmercaptan and water.

6. The composition of claim 5 wherein the amphiphilic polymer has a number average molecular weight of 100 to 3,000.

7. The composition of claim 5 wherein the amphiphilic polymer is a copolymer formed with acrylic acid or methacrylic acid.

8. The composition of claim 5 wherein the amphiphilic polymer is a alkylmercaptan/methacrylic acid copolymer.

* * * * *